United States Patent
Lin et al.

(10) Patent No.: US 12,080,755 B2
(45) Date of Patent: Sep. 3, 2024

(54) MULTI-LAYER POLYSILICON STACK FOR SEMICONDUCTOR DEVICES

(71) Applicant: TEXAS INSTRUMENTS INCORPORATED, Dallas, TX (US)

(72) Inventors: Furen Lin, Chengdu (CN); Yunlong Liu, Chengdu (CN); Zhi Peng Feng, Chengdu (CN); Rui Liu, Chengdu (CN); Rui Song, Chengdu (CN); Manoj K Jain, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 87 days.

(21) Appl. No.: 17/512,484

(22) Filed: Oct. 27, 2021

(65) Prior Publication Data

US 2022/0416014 A1    Dec. 29, 2022

Related U.S. Application Data

(63) Continuation of application No. PCT/CN2021/102341, filed on Jun. 25, 2021.

(51) Int. Cl.
| | |
|---|---|
| *H01L 23/522* | (2006.01) |
| *H01L 21/768* | (2006.01) |
| *H01L 23/495* | (2006.01) |
| *H01L 27/08* | (2006.01) |
| *H01L 29/66* | (2006.01) |
| *H01L 49/02* | (2006.01) |

(52) U.S. Cl.
CPC .............. *H01L 28/91* (2013.01); *H01L 28/92* (2013.01)

(58) Field of Classification Search
CPC ...... H01L 28/91; H01L 28/92; H01L 23/5223; H01L 23/5222; H01L 27/0805; H01L 21/7687; H01L 29/66181
See application file for complete search history.

(56) References Cited

U.S. PATENT DOCUMENTS

| | | | |
|---|---|---|---|
| 6,423,594 B1 | 7/2002 | Tsai et al. | |
| 6,838,334 B1* | 1/2005 | Gluschenkov | ..... H10B 12/0385 438/386 |
| 10,559,650 B2 | 2/2020 | Jia et al. | |
| 10,586,844 B2 | 3/2020 | Lin et al. | |
| 2008/0042208 A1* | 2/2008 | Hshieh | .............. H01L 29/66727 257/E21.409 |
| 2012/0211865 A1* | 8/2012 | Tian | .................... H01L 27/0805 257/532 |

(Continued)

FOREIGN PATENT DOCUMENTS

| | | |
|---|---|---|
| CN | 1209652 A | 3/1999 |
| CN | 101114616 A | 1/2008 |
| CN | 111630655 A | 9/2020 |

OTHER PUBLICATIONS

Corrected Version—Patent Cooperation Treaty (PCT) International Search Report, LV38878, PCT/CN2021/102341, Jun. 25, 2021.

*Primary Examiner* — Omar F Mojaddedi
(74) *Attorney, Agent, or Firm* — Yudong Kim; Frank D. Cimino (57) ABSTRACT

In a described example, a method of forming a capacitor includes forming a doped polysilicon layer over a semiconductor substrate. The method also includes forming a dielectric layer on the doped polysilicon layer. The method also includes forming an undoped polysilicon layer on the dielectric layer.

16 Claims, 11 Drawing Sheets

(56) References Cited

U.S. PATENT DOCUMENTS

| | | | |
|---|---|---|---|
| 2013/0161792 A1* | 6/2013 | Tran | H01L 29/92 |
| | | | 438/386 |
| 2014/0374880 A1* | 12/2014 | Chen | H01L 28/40 |
| | | | 257/532 |
| 2016/0020267 A1* | 1/2016 | Lin | H01L 28/91 |
| | | | 257/532 |

* cited by examiner

MULTI-LAYER POLYSILICON STACK FOR SEMICONDUCTOR DEVICES

TECHNICAL FIELD

This description relates a multi-layer polysilicon stack for semiconductor devices, including integrated trench capacitors.

BACKGROUND

Integrated trench capacitors are known for high density capacitor designs.

Formation of an integrated trench capacitor generally involves forming a deep trench structure in a highly doped silicon substrate, lining the sidewalls and bottom of the trench with at least one dielectric layer, usually silicon oxide, followed by polysilicon filling of the trench that is doped in-situ or after the deposition, and then patterning of the polysilicon layer. Poly residue defects may occur in some existing process flows used to form trench capacitors. Such poly residue defects can lead to poly-to-poly leakage variation.

SUMMARY

In a described example, a method of forming a semiconductor device includes forming a doped polysilicon layer over a semiconductor substrate. The method also includes forming a dielectric layer on the doped polysilicon layer. The method also includes forming an undoped polysilicon layer on the dielectric layer.

In another described example, a capacitor that includes a semiconductor surface layer of a substrate. A doped polysilicon layer is over the semiconductor surface layer. A dielectric layer is on the doped polysilicon layer, and an undoped polysilicon layer is on the dielectric layer.

In a further described example, a semiconductor device includes a semiconductor substrate, a semiconductor surface layer on the semiconductor substrate, and an integrated trench capacitor. The integrated trench capacitor includes a plurality of trenches in the semiconductor surface layer. A first dielectric layer lines respective surfaces of the plurality of trenches. A doped polysilicon layer is on the first dielectric layer and a second dielectric layer is on the doped polysilicon layer. An undoped polysilicon layer is on the second dielectric layer, and a top side metal contact layer is coupled to the doped polysilicon layer in regions lateral to the plurality of trenches.

DETAILED DESCRIPTION

Example embodiments relate to a multi-layered stack, and to a semiconductor device (e.g., an integrated capacitor) formed using the multi-layered stack. In an example, the multi-layered stack includes a doped polysilicon layer over a semiconductor surface layer that is formed on a substrate. A layer of a dielectric material is formed on the doped polysilicon layer, and an undoped polysilicon layer is formed on the dielectric layer. Advantageously, the dielectric layer can also operate as a polysilicon recess etch stop layer during fabrication to reduce poly residue defects that can occur in other approaches.

In an example, the multi-layer stack is used to form an integrated trench capacitor. The trench capacitor includes a plurality of trenches formed in the semiconductor surface layer of the substrate. A dielectric layer lines respective surfaces of the trenches, and the multi-layer stack is formed over the dielectric layer, and the undoped polysilicon layer of the stack can fill the trenches. Top side metal contacts can be coupled to the doped polysilicon layer in regions lateral to the plurality of trenches, and a back side metal contact can be formed on a back side of the substrate. The process window for forming the trench capacitor can be improved. For example, the process window includes an optimized furnace anneal process, in which an existing high temperature process can be omitted and still obtain comparable or better wafer warpage performance. As a result, the examples described herein provide a cost effective approach to fabricate integrated trench capacitors that exhibit comparable or improved performance relative to existing approaches.

As a further example, the multi-layer stack and trench capacitor described herein can be implemented as a stand-alone (discrete) device or be combined with other circuitry on an integrated circuit (IC) chip, or can be embedded in a system-on-chip (SoC) semiconductor chip or multi-chip module (MCM). For example, the MCM can include circuitry (e.g., ICs) configured to implement a power converter with high efficiency. To meet capacitance density goals, each stand-alone capacitor implemented on the MCM can use a deep trench process to enlarge the capacitor surface area. In a further example, to reduce equivalent series resistance, each stand-alone capacitor can be formed with an N+ substrate and have an N− epitaxial layer implemented as the bottom capacitor plate and an undoped polyicon layer of the multi-layer stack can fill gaps in respective trenches to provide a top capacitor plate of the respective stand-alone capacitor. In such examples, the MCMs may include various other elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor devices, including stand-alone capacitors, can be formed from a variety of processes including bipolar, Insulated Gate Bipolar Transistor (IGBT), CMOS, BiCMOS and MEMS.

Figure 1:
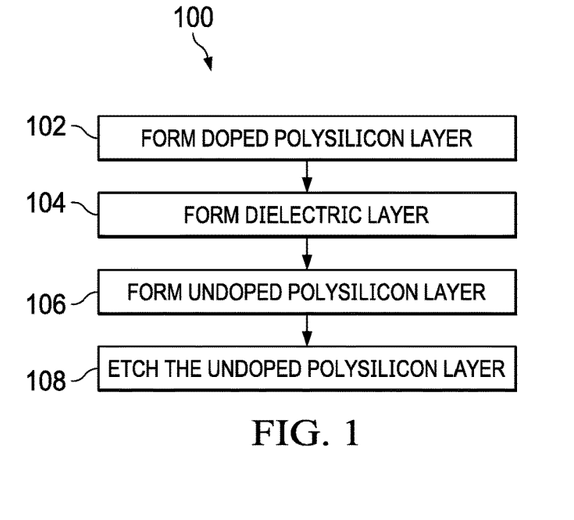
FIG. 1 is a flow diagram depicting an example method of making a multi-layered stack.

FIG. 1 is a flow diagram depicting an example method 100 of making a multi-layer stack. The method 100 is described in relation to the cross-sectional views of FIGS. 2A-2F, which show an example processing progression for forming an example multi-layered stack according to the method 100.

Figure 2A:
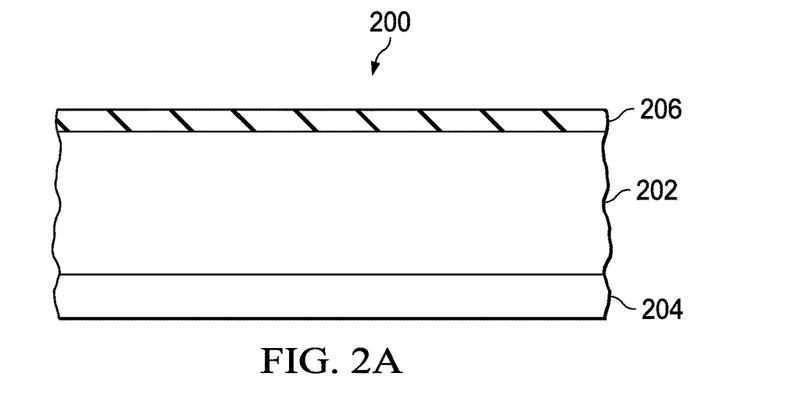
FIGS. 2A-2F are cross-sectional views of a multi-layered stack being made according to the method of FIG. 1.

FIG. 2A shows an example substrate on which the multi-layer stack can be formed. The substrate can include a semiconductor surface layer (SSL) 202 on a bulk semiconductor substrate 204. For example, the SSL 202 includes one or more epitaxial semiconductor surface (ESS) layers formed on the semiconductor substrate 204. In an example, the SSL 202 is deposited on the semiconductor substrate 204 using a conventional epitaxial deposition or an atomic layer deposition (ALD), which is a specialized form of epitaxy that typically deposits alternating monolayers of two elements onto a substrate.

As an example, the substrate 204 and/or SSL 202 can include silicon, silicon germanium, or another semiconductor material. The substrate 204 generally is highly doped (n+ or p+) to limit the equivalent series resistance, such has having a doping level between about $6 \times 10^{19}$ cm$^{-3}$ to about $5 \times 10^{20}$ cm$^{-3}$. The SSL 202 can have a doping level that is less than a doping level of the semiconductor substrate 204, such as reduced by at least a factor of 100, or in other examples, by a factor of 1,000 or more (e.g., having a doping level between about $1 \times 10^{16}$ cm$^{-3}$ to $5 \times 10^{17}$ cm$^{-3}$ or higher). The thickness and resistivity for the SSL 202 can be based on the desired function and performance of the device being made. In an example where the device being made is a trench capacitor, the ESS layer thickness is greater than the trench depth, and can be range between about 20 microns to about 60 microns.

As also shown in FIG. 2A, a dielectric layer 206 can be formed on the surface layer 202, such as by growing a thermal oxide layer on the surface layer 202. In an example, the dielectric layer 206 can use the same thermally grown gate oxide furnace for growing a gate oxide layer for MOS transistors on an IC or multi-chip module that includes the multi-layer stack. The thickness range for the dielectric layer 206 can be between about 10 nm to about 120 nm (e.g., a thickness between about 10 nm and about 50 nm), which will generally depend on the desired capacitance density and power requirements. The dielectric layer 206 having a dielectric constant different (generally higher) as compared to silicon oxide can also be deposited. While not shown in the examples of FIGS. 2A-2F, one or more layers (e.g., a backside polysilicon layer and a silicon oxide layer) can be formed on a bottom side of the substrate 204 to help dopants from escaping out from the bottom side of the substrate, which can cause cross-contamination problems in processing equipment.

Figure 2B:
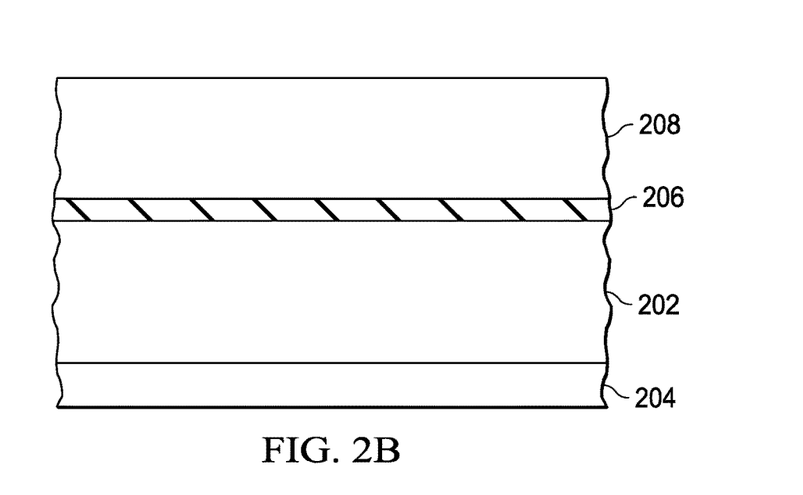

Referring back to FIG. 1, at 102, the method 100 includes forming a doped polysilicon layer over the semiconductor substrate. For example, FIG. 2B shows the doped polysilicon layer 208 on the dielectric layer 206 over the SSL 202. The doped polysilicon layer 208 can be doped to match the doping type of the SSL 202 and the semiconductor substrate 102, and can be doped in situ or as a separate later doping step. As an example, the polysilicon doping level can be between about $5 \times 10^{18}$ cm$^{-3}$ to about $1 \times 10^{20}$ cm$^{-3}$, and the doped polysilicon layer 208 can have a thickness in a range between about 250 nm and about 350 nm.

Figure 2C:
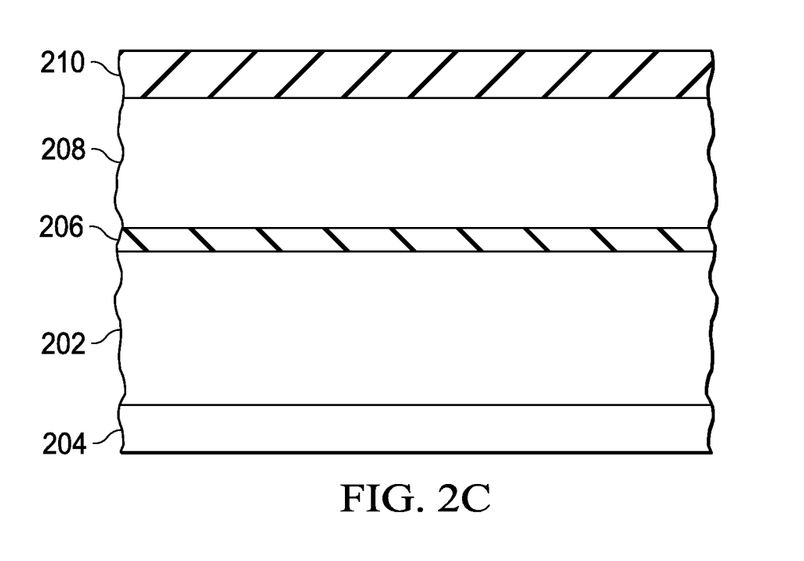

At 104, the method 100 includes forming a layer of a dielectric material on the doped polysilicon layer. FIG. 2C shows dielectric layer 210 on the doped polysilicon layer 208. For example, the dielectric layer 210 can be a tetraethoxysilane (TEOS)-derived silicon oxide layer. As an example, TEOS deposition for a non-plasma deposition process can comprise low pressure chemical vapor deposition (LPCVD) at a pressure of about 300 mTorr and at a temperature of about 700° C. In other examples, a plasma enhanced chemical vapor deposition (PECVD) can be used to form the dielectric layer 210. In still other examples, different dielectric materials can also be used to form the dielectric layer 210, such as including deposited silicon oxides, such as comprising an organosilicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON). The dielectric layer 210 can have a thickness in a range between about 40 nm and about 120 nm. In some examples, the dielectric layer 210 operates as or forms part of a pre-metal dielectric for node contact.

Figure 2D:
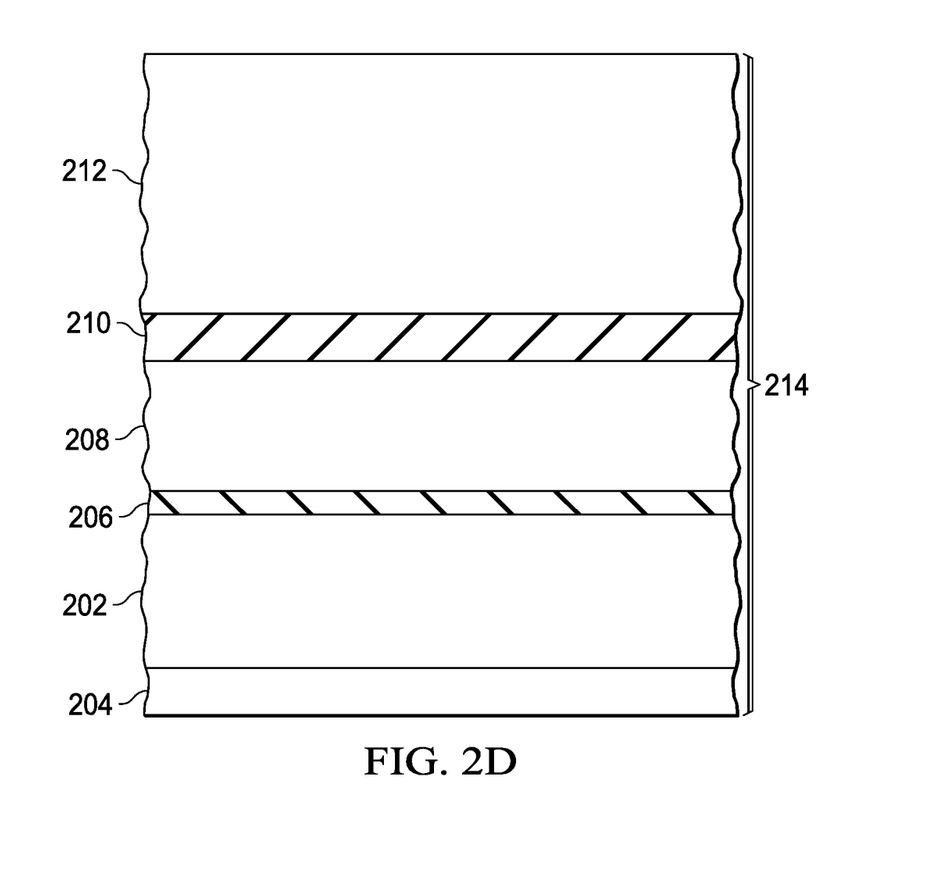

At 106, the method 100 includes forming an undoped polysilicon layer on the dielectric layer. FIG. 2D shows the undoped polysilicon layer 212 on the dielectric layer 210 to form a multi-layer structure 214. In an example, the undoped polysilicon layer 212 has a thickness in a range between about 650 nm and about 1000 nm. The multi-layer structure 214 can be used for an integrated trench capacitor, as described herein, which may be implemented in an integrated circuit or a multi-chip module.

Figure 2E:
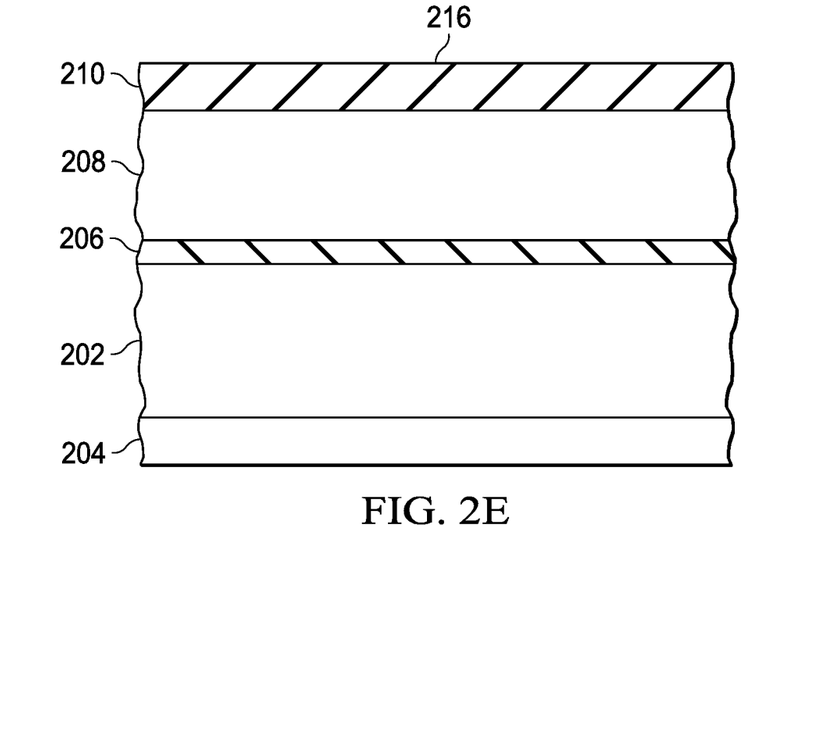

At 108, the method includes etching the undoped polysilicon layer. For example, FIG. 2E shows the undoped polysilicon layer 212 etched (e.g., by plasma dry etching) to expose a surface 216 of the dielectric layer 210. The dielectric layer 210 thus can operate as an etch stop layer for top side polysilicon etching process (at 108) to reduce polysilicon residue that might otherwise result from the polysilicon etch back. In some examples, a masking layer pattern (not shown) may be used to can be used to control one or more regions in which the polysilicon etch back is performed. In other examples, the etching at 108 can be implemented as a blanket polysilicon etching process to remove the undoped polysilicon layer 212.

Figure 2F:
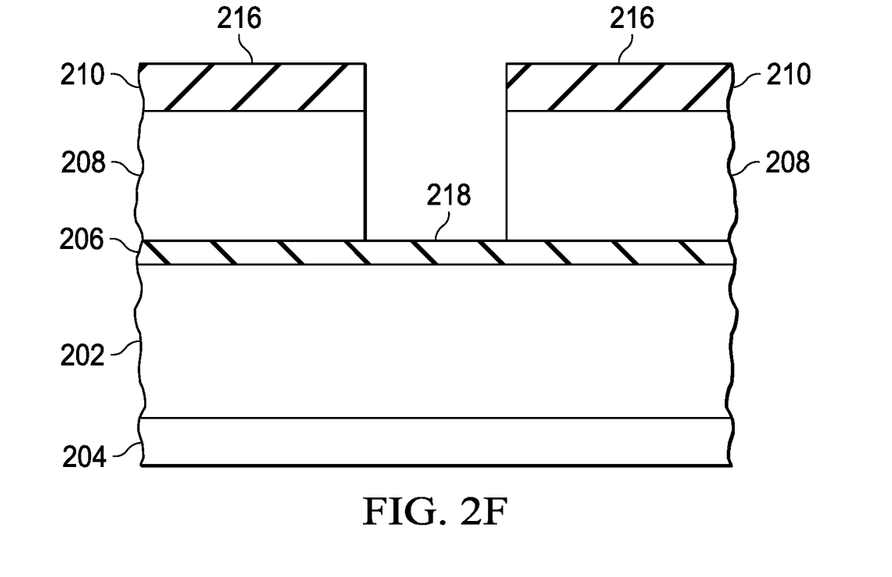

FIG. 2F shows an example of further etching that can be performed using a patterned masking layer (not shown). In the example of FIG. 2F, one or more parts of the dielectric layer 210 and the doped polysilicon layer 208 have been etched back to expose a surface of the dielectric layer 206. After a patterned masking layer has been applied to the multi-layer structure of FIG. 2E, one or more regions between patterned masking layer can be can be etched. For example, the dielectric layer 210 can be etched in a first etch back process and the doped polysilicon layer 208 can be etched in a second etch back process. During each etch back process, chamber conditions (e.g., gas, power temperature, pressure etc.) can be changed to facilitate removing respective layers 210 and 208.

Additionally, after etching of the undoped polysilicon layer at 108, one or more metal contacts (not shown) can be formed over respective contact regions to couple to the doped polysilicon layer 208. For example, one or more metal contacts (e.g., titanium, aluminum copper, titanium nitride, metal silicide and/or other metals) can couple to the doped polysilicon layer through the dielectric layer 210. A back side metal layer can also be formed on a bottom surface of the structure coupled to the substrate 204. The metal contacts and/or metal layer can be implemented as silver, titanium, nickel or another metal. Thus, the multi-layer stack can be coupled between respective contacts. In an example, the undoped polysilicon layer 108 can be floating or, in another example, reside within another structure (e.g., a trench) formed in substrate, such as described below.

Figure 3:
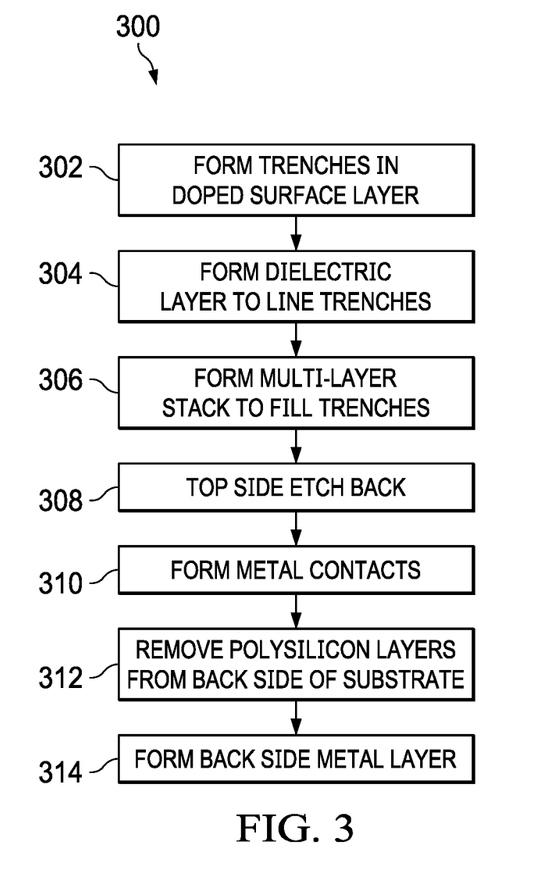
FIG. 3 is a flow diagram depicting an example method of making an integrated trench capacitor.

FIG. 3 is a flow diagram depicting an example method 300 of making an integrated trench capacitor. The method 300 is described in relation to the cross-sectional views of FIGS. 4A-4G, which show an example processing progression for forming an example trench capacitor according to the method 300.

Figure 4A:
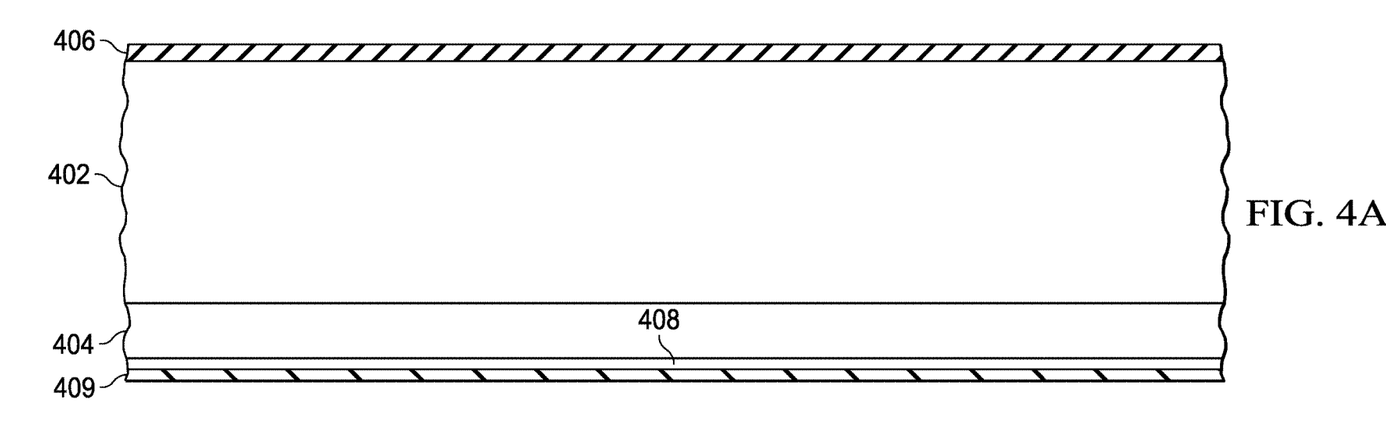
FIGS. 4A-4G are cross-sectional views of an integrated trench capacitor being made according to the method of FIG. 3.
Figure 4B:
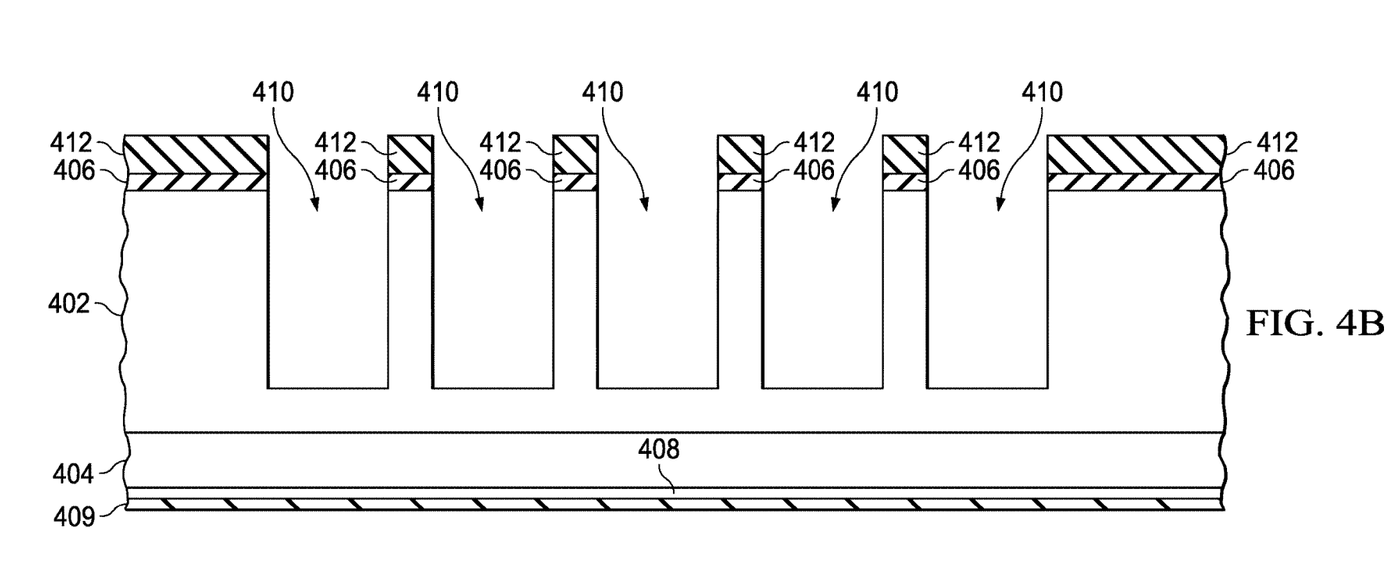

FIG. 4A shows an example of part of a starting wafer on which the integrated trench capacitor can be formed. The example starting wafer can include a doped semiconductor surface layer 402 (e.g., one or more ESS layers) on a highly doped bulk semiconductor substrate 404. The ESS layer 402 can be deposited onto the substrate by epitaxial deposition, ALD or it can be grown on the substrate 404 by other methods. An oxide layer 406 can be formed on the ESS layer, such as grown by thermal oxidation. The wafer can also include one or more back side layers on a bottom side of the substrate 204. As shown in the example of FIG. 4A, the back side layers include a back side polysilicon layer 408 and an oxide (e.g., silicon oxide) layer 409. The layers 408 and 409 thus can be configured as protective layers that provide a seal to help dopants from escaping out from the bottom side of the substrate during processing.

After the starting wafer is provided, at 302, the method 300 includes forming a plurality of trenches in the ESS layer 402 of the semiconductor substrate. For example, the plurality of trenches 410 can be formed by etching (e.g., plasma dry etching) to remove the oxide layer 406 and a portion of the ESS layer through a patterned masking layer 412. The patterned masking layer 412 can include a photoresist and/or hardmask layer material formed on the oxide layer 406. The etching used to form the trenches at 302 can include anisotropic etching to etch through the dielectric layer 406, and into the ESS layer 402, but not reaching the top of the substrate 404. As a result, a bottom of the trenches 410 are spaced above the top of the semiconductor substrate 404 by a remaining thickness of the ESS layer. While in the example of FIG. 4B the photoresist layer 412 is shown as remaining intact after the trench formation, much of the photoresist layer 412 may have been removed by the trench formation (e.g., etching) process at 302.

The trenches 410 extend into the ESS layer 402 a depth that is less than the total thickness of the ESS layer 402. For example, the trenches are formed through at least one half of a thickness of the ESS layer 402. In an example, the ESS layer 402 has a thickness ranging between about 20 microns to about 60 microns, and the trenches extend into the ESS layer 402 a depth ranging from about 10 microns to about 50 microns, which can vary depending on desired capacitance density. While the example of FIGS. 4A-4G shows the trench capacitor being formed on a wafer of an integrated circuit, in other examples trench capacitors described herein can also be implemented as stand-alone (discrete) capacitors including tens of thousands or hundreds of thousands of trenches.

Figure 4C:
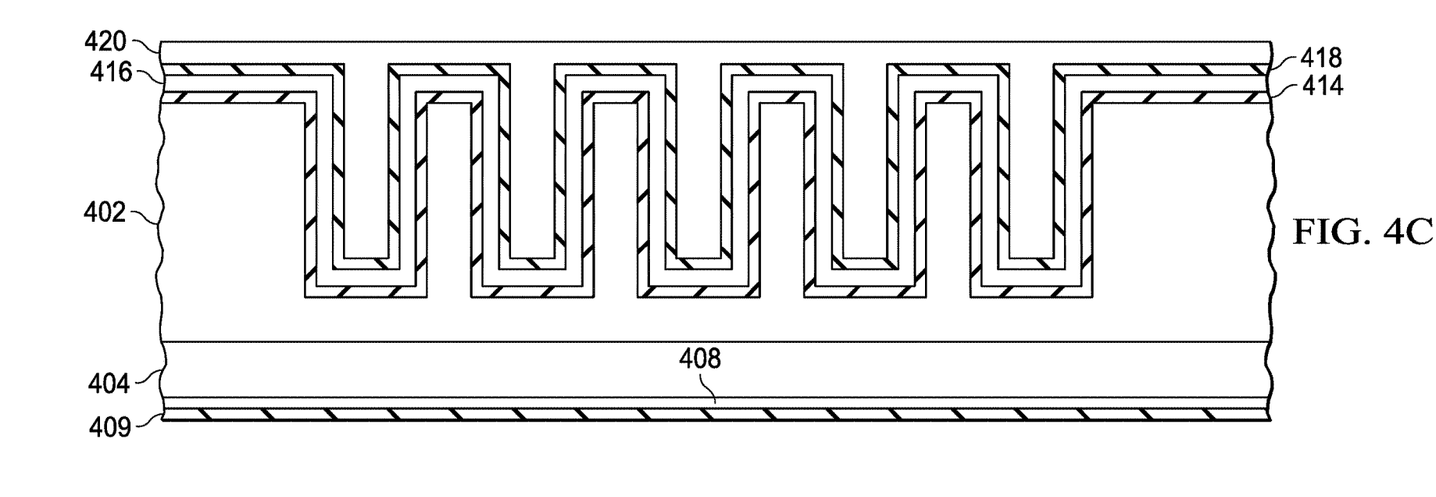

At 304, the method 300 includes forming a dielectric layer to line the trenches 410. For example, FIG. 4C shows a capacitor dielectric layer 414 formed (e.g., grown or deposited) on the sidewalls and the bottom surfaces of the trenches 410 as well as on surface regions of the ESS layer 402 between respective trenches (after photoresist and oxide layers 406 and 412 have been removed). In one example, the dielectric layer 414 is a single layer that comprises silicon oxide. For example, the dielectric layer 414 can be a gate oxide layer that is thermally grown using the same gate oxide furnace used to form a gate oxide layer for one or more metal oxide semiconductor (MOS) transistors located on the same IC being fabricated. In another example, the dielectric layer 414 comprises two or more dielectric layers. As an example, a silicon oxide dielectric layer can have a thickness ranging from about 10 nm to about 500 nm, such as about 50 nm thick, which can vary depending on the power requirements and/or operating voltage for which the capacitor has been designed. As described above, the dielectric layer 414 may also be deposited as multiple layers. In one example, the dielectric layer 414 comprises an oxide-nitride-oxide (ONO) layer stack.

At 306, a multi-layer stack is formed to fill the trenches. The multi-layer stack can be formed according to the method of FIG. 1 and include a doped polysilicon layer, a dielectric (e.g., TEOS-derived oxide) layer and an undoped polysilicon layer. FIG. 4C shows the multi-layer stack formed over the dielectric layer 414. For example, the multi-layer stack includes a doped polysilicon layer 416, a dielectric layer 418 and an undoped polysilicon layer 420. As an example, the doped polysilicon layer 416 is formed over the ESS layer 402 by deposition on the dielectric layer, and can be doped in-situ or after deposition (e.g., furnace doped). For example, a p+ polysilicon can be used in combination with a p-type ESS layer 402 and p-type substrate 404, and n+ polysilicon can be used for an n-type ESS layer 402 and n-type substrate 404. The doped polysilicon layer 416 can have a thickness in a range between about 250 nm and about 350 nm. The dielectric layer 418 can be deposited (e.g., using a CVD or other deposition process) on the doped polysilicon layer 416 with a thickness having a range between about 40 nm and about 120 nm. The undoped polysilicon layer 420 can be formed by depositing polysilicon (e.g., using an LPCVD process) on the dielectric layer 418 to fill the trenches 410. For example, the undoped polysilicon layer 418 that fills the trenches is configured to operate a top plate of the capacitor being formed. An amount of undoped polysilicon layer 420 can be deposited to fill the respective trenches 410 partially, completely or overfilled, such as shown in FIG. 4C. For example, the undoped polysilicon layer 420 has a thickness in a range between about 650 nm and about 1000 nm, as measured from the dielectric layer 418.

Figure 4D:
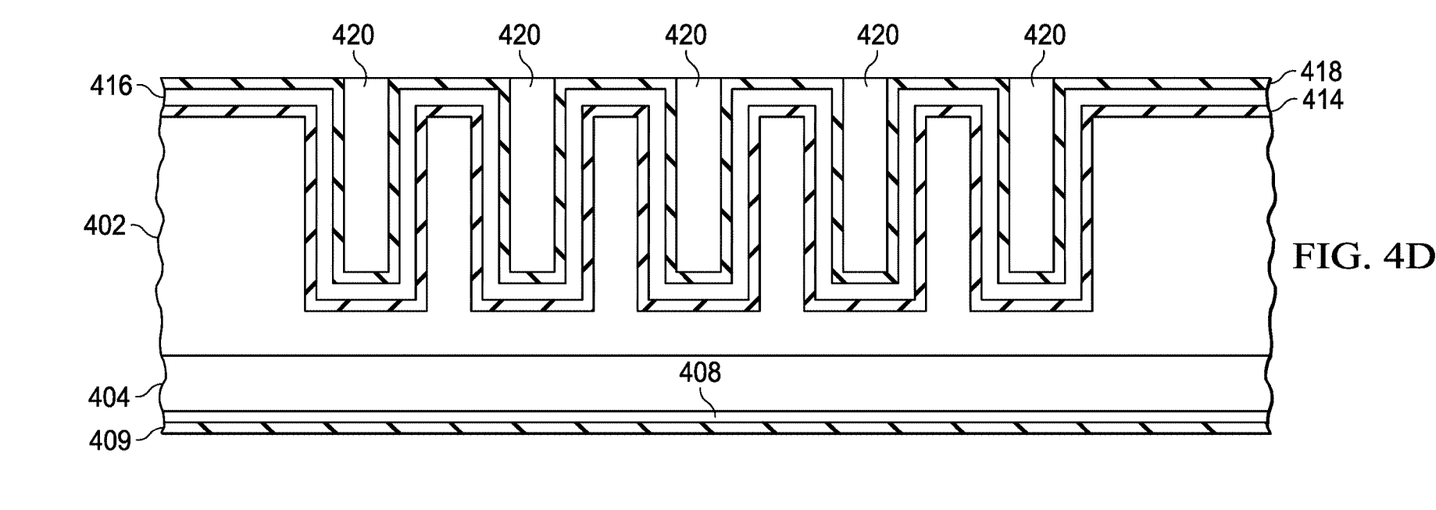

At 308, the method 300 includes a top side etch back. As shown in FIG. 4D, the undoped polysilicon layer 420 can be removed from the top surface by an etching process (e.g., plasma dry etching) to expose the dielectric layer 418 and the multi-layer stack, including layers 416, 418 and 420, within the trenches 410. For example, the undoped polysilicon above and in regions lateral to the respective trenches can be completely removed by the etching at 308, as shown in FIG. 4D. The dielectric layer 418 thus can operate as etch back stop layer for top side etching process (at 308) to reduce polysilicon residue that might otherwise result from the polysilicon etch back.

Figure 4E:
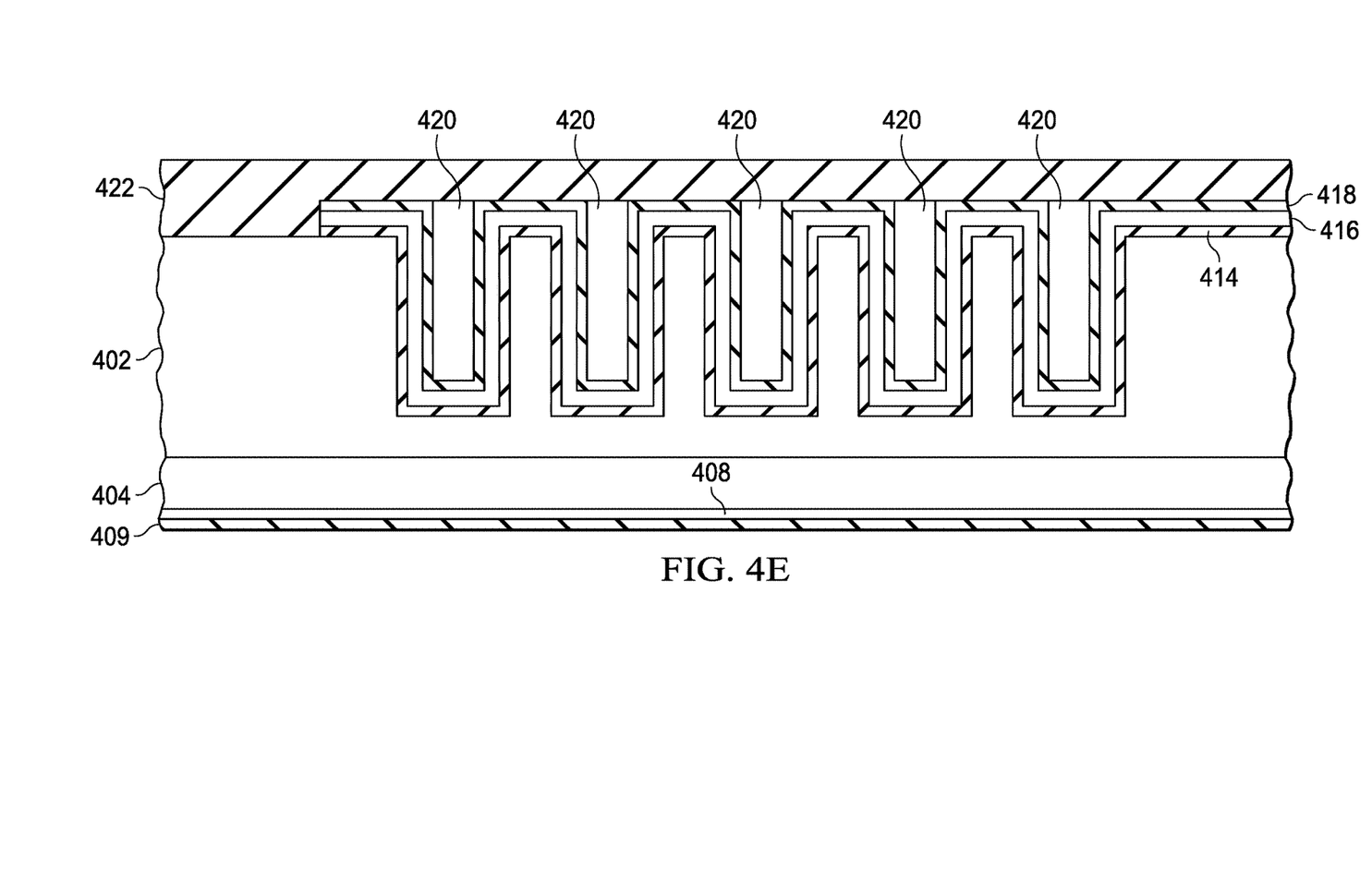

At 310, the method 300 includes forming top side metal contacts that are coupled to the doped polysilicon layer 416 in the regions lateral to the respective trenches. For example, as shown in FIG. 4E, one or more inter-layer dielectric layers 422 can be formed on the top surface, such as by deposition of one or more dielectric materials. Examples of dielectric materials to form the inter-layer dielectric layer 422 include TEOS-derived oxide layers, which can be deposited using LPCVD or another deposition process. However, other dielectric layers can also be used including deposited silicon oxides, a doped dielectric layer (e.g., FSG), or a SiN layer or its variants (e.g., SiON). As a further example, where the inter-layer dielectric layer 422 includes multiple layers, the process of forming the layer 422 can include a sequence of deposition, reflow, cleaning and polishing. Also, prior to forming metal contacts at 310, the method 300 can include forming one or more top capacitor plates, which can include patterning the polysilicon. As described herein, the undoped polysilicon 420 that fills the respective trenches can function as the top capacitor plate, and can be contacted by forming one or more patterned metal contacts.

Figure 4F:
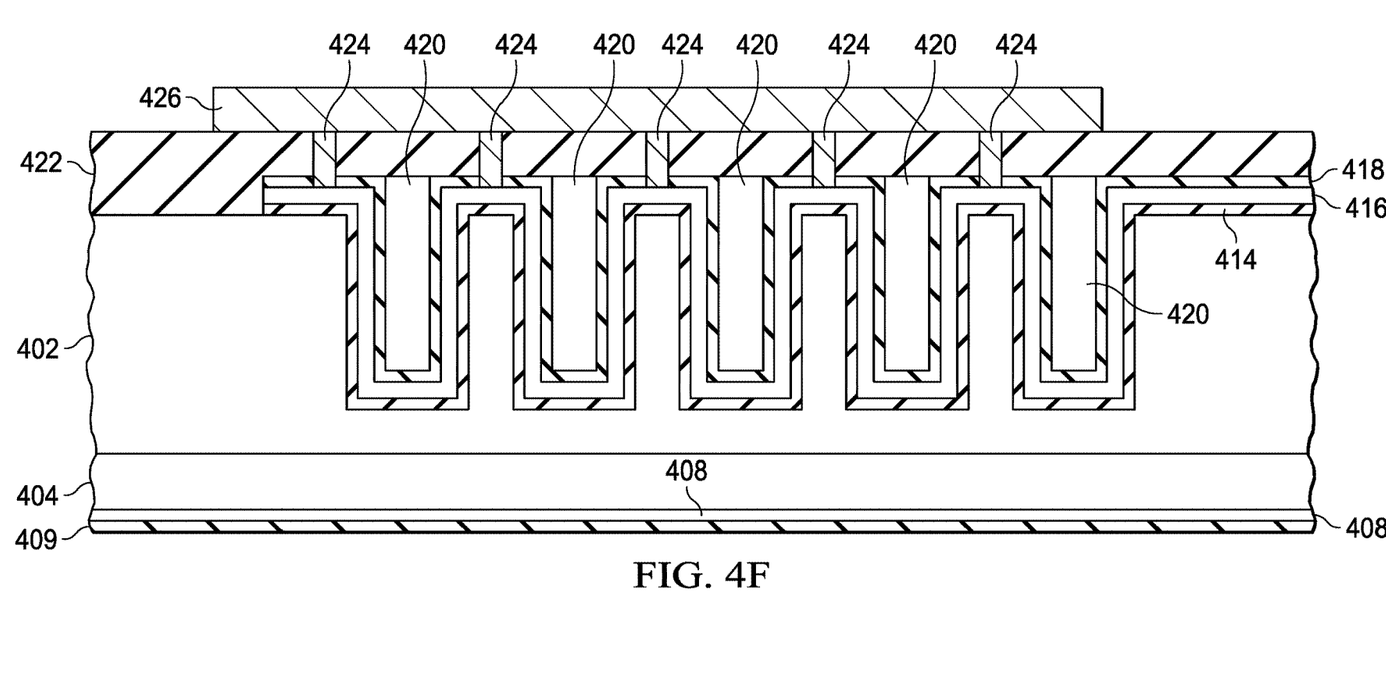

FIG. 4F shows an example metal contacts 424 formed through the inter-layer dielectric layer 422. For example, the inter-layer dielectric layer 422 can be patterned and etched to form contact vias through the inter-layer dielectric layer 422 and aligned with regions between respective trenches. The contact vias thus can be formed through the inter-layer dielectric layer 422 and the dielectric layer 418 for exposing the doped polysilicon layer 416 in the regions lateral to the respective trenches. A metal material is then deposited to fill the contact vias (e.g., W filled) and thus form respective contacts 424 coupled to the doped polysilicon layer 416. One or more metal contact layers 426 can be formed over the inter-layer dielectric layer 422 coupled to respective contacts 424 to contact a top plate (e.g., trench fill layers 416, 418 and 420) of the trench capacitor. The metal used to form the contacts 424 and metal layer 426 can comprise titanium, aluminum copper, titanium nitride, metal silicide, tungsten and/or other metals.

Figure 4G:
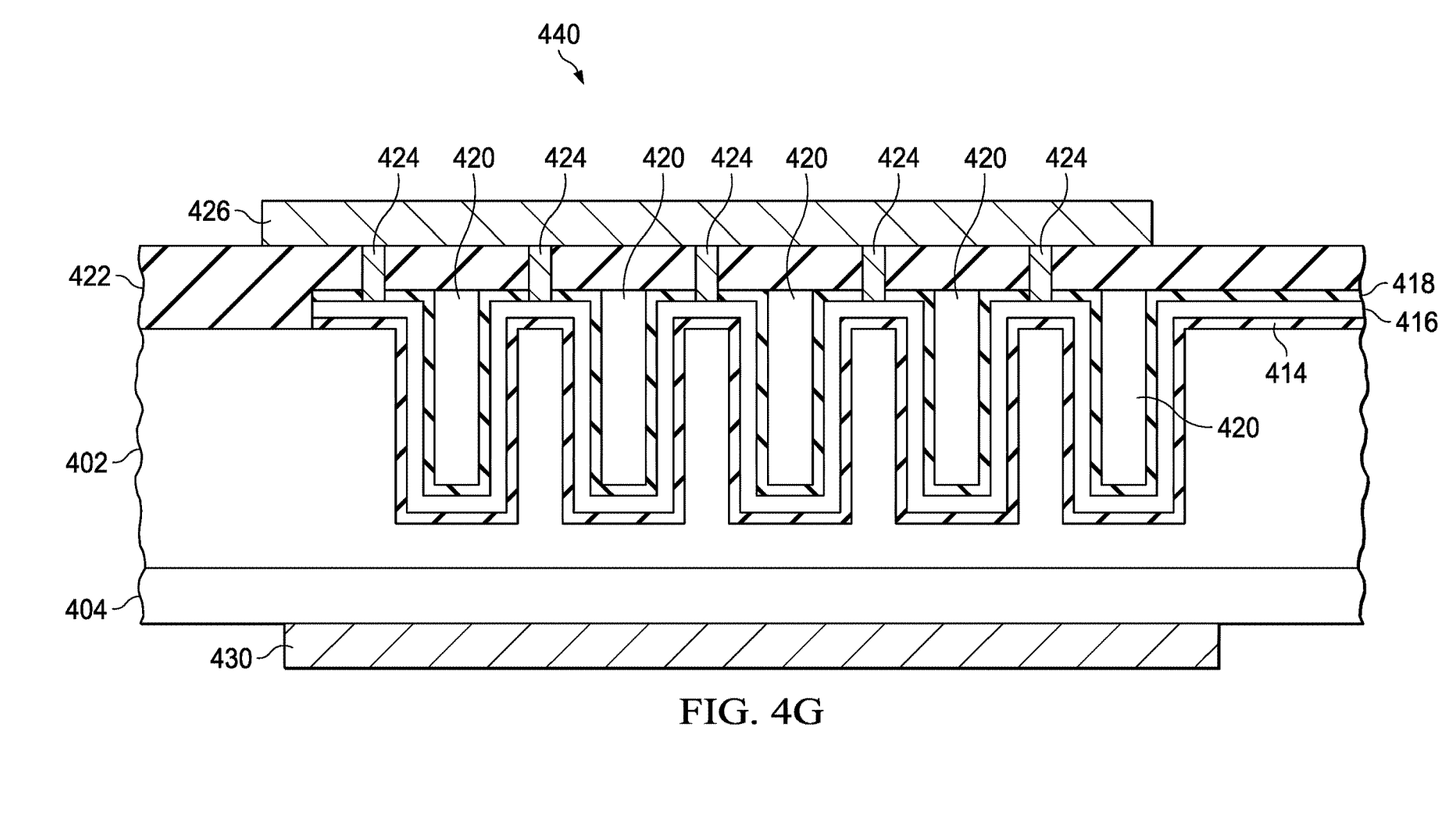

At 312, the method 300 includes removing polysilicon and protective layers from a back side of the substrate. After the back side layers have been removed to expose the heavily doped substrate 404, the method 300 includes forming a back side metal layer at 314. For example, FIG. 4G shows an integrated trench capacitor 440 in which respective polysilicon and protective oxide layers 408 and 409 have been removed and a back side metal layer 430 has been formed on a bottom side of the wafer. For example, the layers 408 and 409 can be removed by wafer backgrinding or another process. The back side metal layer 430 can be deposited on the bottom side of the wafer to provide bottom plate contact for the trench capacitor 440. The back side metal layer 430 can also provide a solderable die attach metal stack to ensure good electrical contact to the back side of the integrated circuit (ohmic contact) or proper bonding of the chips to their mounting cases. The back side metal layer 430 can comprise gold or silver on titanium on nickel or other metals. Additional BEOL processing, die separation and packaging may be performed to form respective integrated circuits, each of which includes one or more of the integrated trench capacitors 440. In another example, additional top side contacts can be formed to contact the bottom plate of the trench capacitor (e.g., instead of using the back side metal layer 430).

Figure 5:
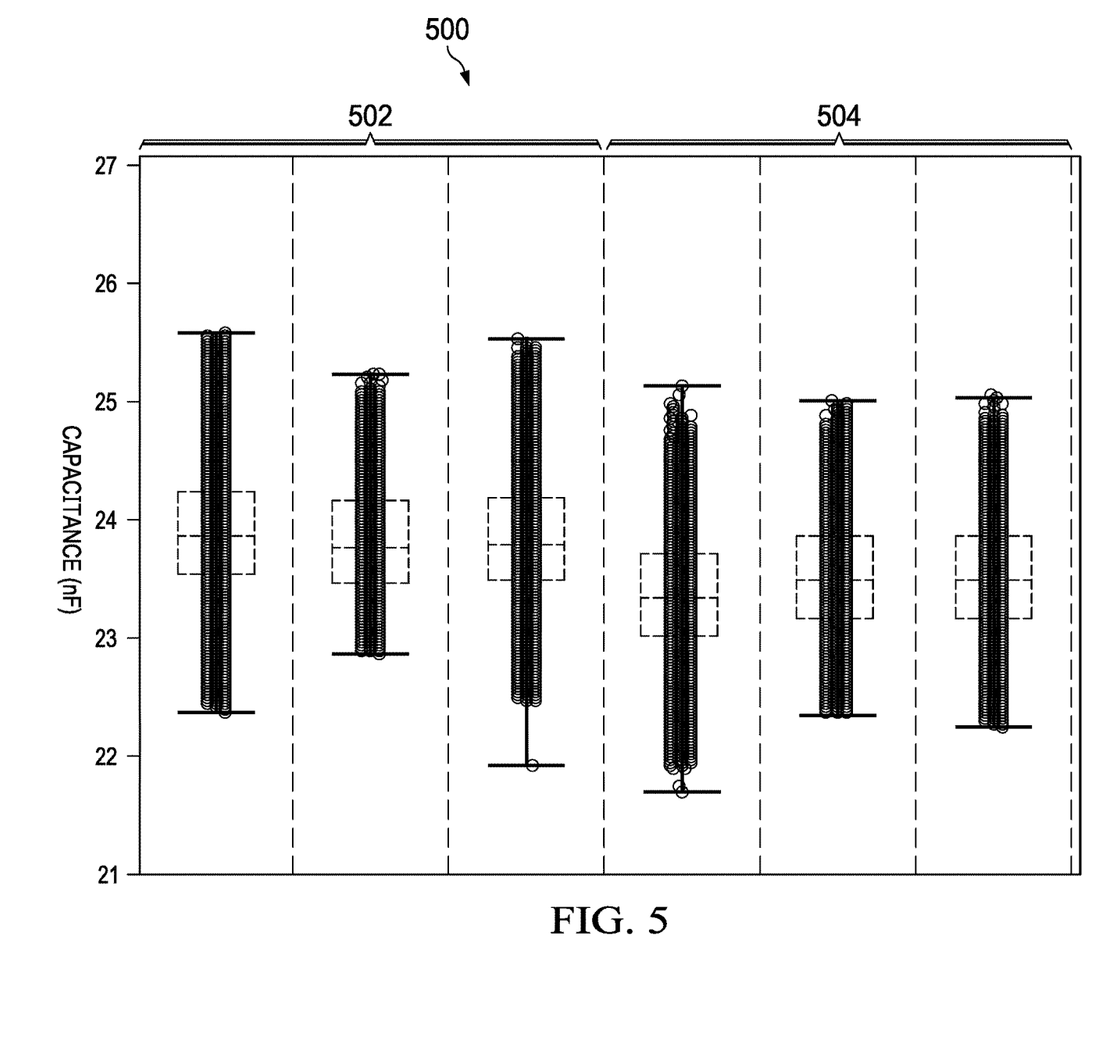
FIG. 5 is a graph showing capacitance of an example capacitor compared to capacitance of an existing capacitor.

FIG. 5 is a graph 500 showing capacitance of several lots of capacitors, including capacitors produced according to an existing design, shown at 502, and example capacitors produced according to the design described herein, shown at 504. A comparison of the ranges of capacitance for the respective lots demonstrates that the capacitor design and method of making capacitors (e.g., having the multi-layer stack) described herein are comparable to existing capacitor designs, at least in terms of capacitance.

Figure 6A:
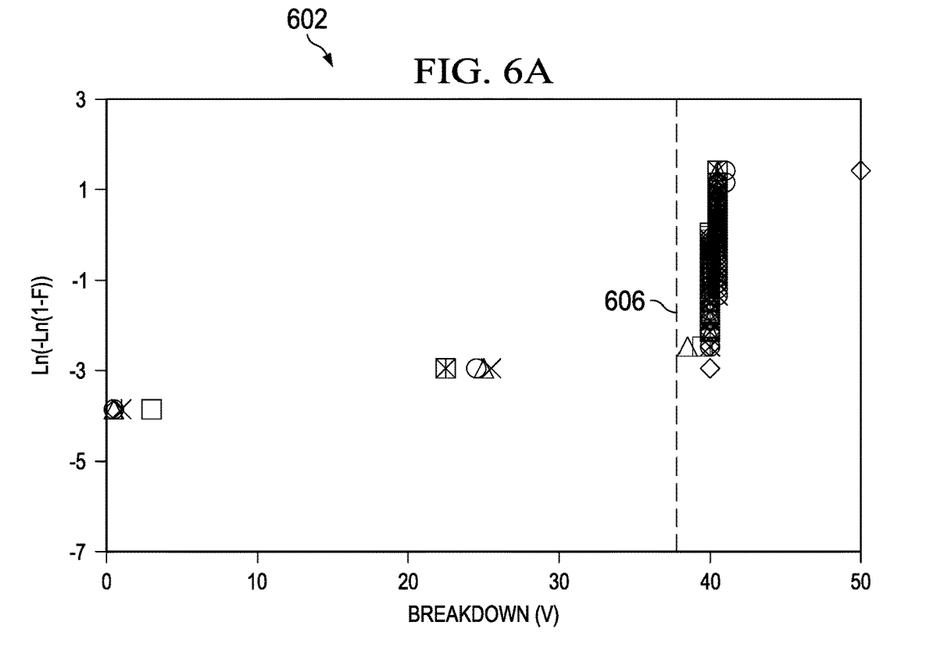
FIGS. 6A and 6B are graphs showing breakdown voltages for an existing capacitor design compared to a capacitor design according to an example embodiment described herein.
Figure 6B:
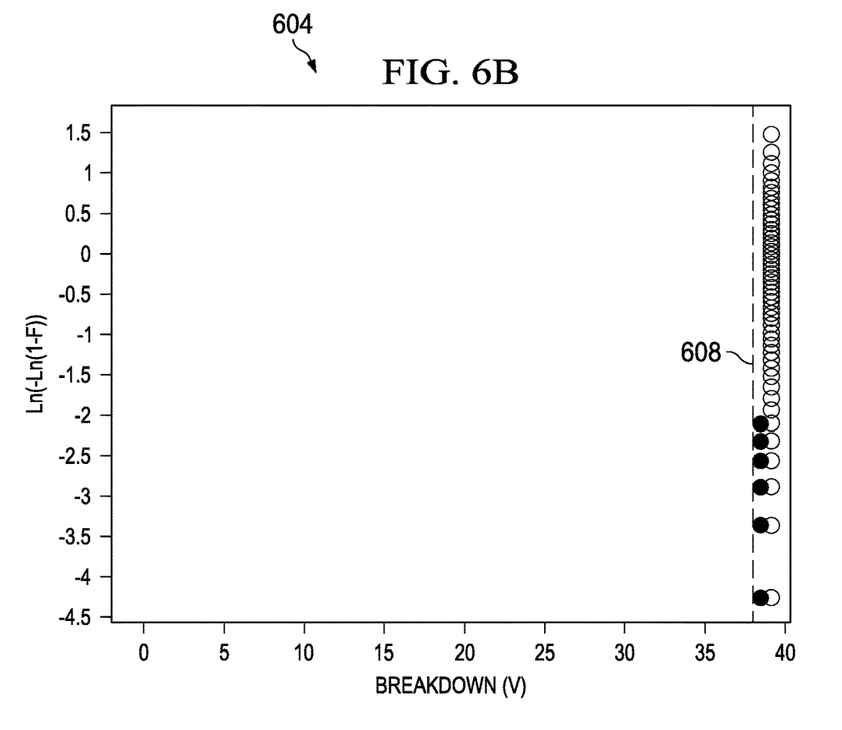

FIGS. 6A and 6B include graphs 602 and 604, respectively, showing a comparison of breakdown voltages for an existing capacitor design, shown in graph 602, and a capacitor design according to an example embodiment described herein, shown in graph 604. A comparison of the data shown in graphs 602 and 604 demonstrates that there are some outliers (early fails) for capacitors having an existing design, shown in graph 602 to the left of a specified minimum breakdown voltage 606. In contrast, capacitors according to the design described herein exhibit a tighter distribution of breakdown voltage (e.g., without outliers to the left of the specified minimum breakdown voltage 608).

Advantageously, the comparable capacitance and improved breakdown voltage characteristics, which can be achieved by capacitors formed according to methods described herein, can be made with a reduced number of processing steps due to having fewer layers and removing a furnace anneal process. The reduction in processing steps results in an associated cost savings.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A method of forming a semiconductor device, comprising:
    forming a plurality of trenches in a surface layer of a semiconductor substrate;
    forming a first dielectric layer that lines a surface of the plurality of trenches;
    forming a doped polysilicon layer on the first dielectric layer;
    forming a second dielectric layer on the doped polysilicon layer;
    forming an undoped polysilicon layer on the second dielectric layer;
    removing the undoped polysilicon layer in regions of the surface layer lateral to the plurality of trenches, wherein the second dielectric layer in the regions of the surface layer is exposed as a result of removing the undoped polysilicon layer; and
    removing a protective layer from a back side of the semiconductor substrate.

2. The method of claim 1,
    wherein the second dielectric layer that is exposed provides a stop layer.

3. The method of claim 1, wherein
    the undoped polysilicon layer fills the plurality of trenches.

4. The method of claim 1, wherein removing the undoped polysilicon layer in the regions of the surface layer lateral to the plurality of trenches includes etching back the undoped polysilicon layer to expose the second dielectric layer, which provides an etch stop layer.

5. The method of claim 1, further comprising forming metal contacts coupled to the doped polysilicon layer in the regions of the surface layer lateral to the plurality of trenches.

6. The method of claim 1, wherein the protective layer includes a polysilicon layer and an oxide layer.

7. The method of claim 1, further comprising depositing a metal layer on the back side of the semiconductor substrate after removing the protective layer.

8. The method of claim 1, wherein forming the first dielectric layer comprises growing a thermal oxide layer.

9. The method of claim 1, wherein forming the second dielectric layer comprises depositing a tetraethoxysilane (TEOS)-derived oxide material.

10. The method of claim 1, wherein:
the first dielectric layer has a thickness in a range between about 40 nm and about 120 nm; and
the second dielectric layer has a thickness in a range between about 40 nm and about 120 nm.

11. The method of claim 1, wherein:
the doped polysilicon layer has a thickness in a range between about 250 nm and about 350 nm; and
the undoped polysilicon layer has a thickness in a range between about 650 nm and about 1000 nm.

12. The method of claim 1, wherein the first dielectric layer has a dielectric constant greater than silicon oxide.

13. The method of claim 1, wherein the first dielectric layer includes two or more dielectric layers.

14. The method of claim 1, wherein the first dielectric layer includes an oxide-nitride-oxide (ONO) layer stack.

15. The method of claim 1, wherein the semiconductor substrate has a doping level that is greater than the surface layer by a factor of 100 or more.

16. The method of claim 1, wherein the surface layer, the semiconductor substrate, and the doped polysilicon layer includes the same conductivity type dopants.

\* \* \* \* \*